US009188604B2

(12) United States Patent
Rother et al.

(10) Patent No.: US 9,188,604 B2
(45) Date of Patent: Nov. 17, 2015

(54) MEASURING INSTRUMENT FOR TESTING VOLTAGE

(71) Applicant: Weidmueller Interface GmbH & Co. KG, Detmold (DE)

(72) Inventors: Grit Rother, Lemgo (DE); Andreas Giese, Detmold (DE); Herbert Ehlers, Blomberg (DE); Lars Topp, Detmold (DE); Lars Kuehne, Paderborn (DE); Armin Herzog, Detmold (DE)

(73) Assignee: Weidmueller Interface GmbH & Co. KG, Detmold (DE)

( * ) Notice: Subject to any disclaimer, the term of this patent is extended or adjusted under 35 U.S.C. 154(b) by 215 days.

(21) Appl. No.: 13/902,940

(22) Filed: May 27, 2013

(65) Prior Publication Data

US 2013/0320962 A1    Dec. 5, 2013

(30) Foreign Application Priority Data

Jun. 4, 2012   (DE) .................... 20 2012 102 032 U

(51) Int. Cl.
*G01R 1/06*    (2006.01)
*G01R 1/04*    (2006.01)
*G01R 1/067*   (2006.01)
*G01R 19/155*  (2006.01)

(52) U.S. Cl.
CPC .............. *G01R 1/04* (2013.01); *G01R 1/06788* (2013.01); *G01R 19/155* (2013.01)

(58) Field of Classification Search
CPC ........... G01R 1/06727; G01R 1/06788; G01R 1/06705; G01R 31/2886; G01R 1/06711; G01R 1/06716; G01R 1/06738; G01R 1/0675; G01R 33/62; G01R 1/06772; G01R 1/067; G01R 1/073; G01R 31/2851; G01R 31/026
See application file for complete search history.

(56) References Cited

U.S. PATENT DOCUMENTS 3,515,989 A     6/1970   Palmer
7,439,729 B2 *  10/2008  Azimi et al. ............... 324/750.3

FOREIGN PATENT DOCUMENTS

DE    2912826 A1    10/1980
FR    2575837       7/1986

* cited by examiner

*Primary Examiner* — Tung X Nguyen
(74) *Attorney, Agent, or Firm* — Lawrence E. Laubscher, Sr.; Lawrence E. Laubscher, Jr.; Robert D. Spendlove

(57) ABSTRACT

A measuring instrument, in particular a voltage tester, is provided having two probes which are arranged in separate housings through which connecting cables extend. The housings are magnetically attractive, because of either a first magnet arranged on a first one of the housings for cooperation with the magnetic material of the other housing, or a corresponding pair of opposed magnets provided in magnetically attractive relation on the two housings, respectively. Recesses are provided in the second housing opposite the corresponding magnets of the first housing. Corresponding pivot ribs extend circumferentially around the housings in the space between the first one magnet and the adjacent probe end, thereby to permit accurate spacing of the probes during the taking of a test measurement.

10 Claims, 2 Drawing Sheets ated with the magnetic material of the other housing, or a corresponding pair of opposed magnets provided in magnetically attractive relation on the two housings, respectively.

MEASURING INSTRUMENT FOR TESTING VOLTAGE

REFERENCE TO RELATED APPLICATIONS

This application corresponds with and claims priority of the German application No. DE 20 2012 102 032.7 filed Jun. 4, 2012.

BACKGROUND OF THE INVENTION

1. Field of the Invention

A measuring instrument, in particular a voltage tester, is provided having two probes which are arranged in separate housings through which connecting cables extend. The housings are magnetically attractive, because of either a first magnet arranged on a first one of the housings for cooperation with the magnetic material of the other housing, or a corresponding pair of opposed magnets provided in magnetically attractive relation on the two housings, respectively.

2. Description of Related Art

Measuring instruments are known, whose probes are connected to one another by sufficiently long connecting cables, so that the tester can drape the cable over himself. The tester can therefore also comfortably carry the measuring instrument with him when he is currently not carrying out a measurement.

Such measuring instruments are, for example, voltage testers or universal measuring instruments, using which, for example, voltages, currents, powers, resistances, and/or a line continuity can be tested.

In the case of these measuring instruments, two probes are normally arranged in separate housings, which are connected to one another by the cable. The measuring instrument is handled in such a manner that one of the probes is taken in each hand. During the measurement, the distance of the probes from one another can therefore be directly manually set.

The Palmer U.S. Pat. No. 3,515,989 discloses such a measuring instrument having two test probes arranged in separate housings, in the case of which a linear rod magnet is respectively arranged on each of the two housing parts. The arrangement of the rod magnets of the housings is provided corresponding to one another so that the magnetic north pole of one rod magnet is provided opposite to the magnetic south pole of the other rod magnet. This arrangement allows one-handed handling of the measuring instrument.

SUMMARY OF THE INVENTION

Accordingly, a primary object of the invention is to provide a measuring instrument in which a pair of hollow probe housings are provided each having first and second ends, a pair of probes mounted in corresponding first ends of said housings, respectively, a pair of cables extending from corresponding second ends of said housings, respectively, said cables extending internally of said housings and being connected with said probes, respectively, magnetic means normally biasing said housings together toward a parallel transport condition relative to each other, said magnetic means including a first magnet arranged on a first one of said housings adjacent and spaced from the associated probe. Corresponding pivot ribs are arranged the probe housings adjacent the first housing ends, thereby to afford precise pivotal relative movement of said housings to vary the spacing distance between said probes.

The invention has the object of further improving the handling capability of such a measuring instrument, wherein the housings are magnetically attractive in the unused state. The housings can therefore be laid against one another and magnetically adhere to one another. It is therefore more difficult to lose the draped measuring instrument, for example, during walking. This embodiment of the housing additionally has the advantage that during a measurement the housings are detached from one another against the magnetic attraction force. It has been shown that the handling of the measuring instrument is thus easier.

In a preferred embodiment, a magnet is arranged on at least one of the housings, wherein at least a part of the other housing is manufactured from a magnetically conductive material. In this embodiment, the magnetic attraction force between the housings is producible by only one magnet. In another preferred embodiment, a magnet is provided on each of the housings, wherein the magnets are provided with opposite polarization to one another. In this embodiment, the magnets are preferably arranged corresponding to one another on the housings, so that their distance to the probe end is equal. Because of their opposing polarization, these magnets attract one another, so that the housings are drawn toward one another.

In a further preferred embodiment, two magnets which are spaced apart from one another are provided on one or both housings. In the case of this arrangement, it is preferable to adapt the attraction force of the two magnets to one another in such a way that pivoting of the housings at the probe end is thus made easier. For this purpose, the attraction force of the magnet or magnets spaced farther away from the probe end is preferably greater than the attraction force of the magnet or magnets arranged closer to the probe end.

The measuring instrument is distinguished in that, corresponding to the arrangement of the magnets of one housing, recesses are provided in the housing sheath on the other housing. The recesses preferably respectively have the same distance from the probe end as the magnet corresponding thereto. Upon joining of the housings to one another or when the housings are joined on one another, respectively, the magnets of one housing therefore engage in the recess corresponding thereto of the other housing. Either an electrically conductive part of the other housing or other magnets are accessible through the recesses.

It is desirable to provide cooperating pivot edges on the probe ends of both housings. The pivot edge allows pivoting of the housings away from one another. The distance of the probes from one another is therefore determined by pivoting the housings away from one another. This is optionally also possible with one hand depending on the housing dimensions.

BRIEF DESCRIPTION OF THE DRAWINGS

Other objects and advantages of the invention will become apparent from a study of the following specification, when viewed in the light of the accompanying drawing, in which.

DETAILED DESCRIPTION OF THE INVENTION

Figure 1:
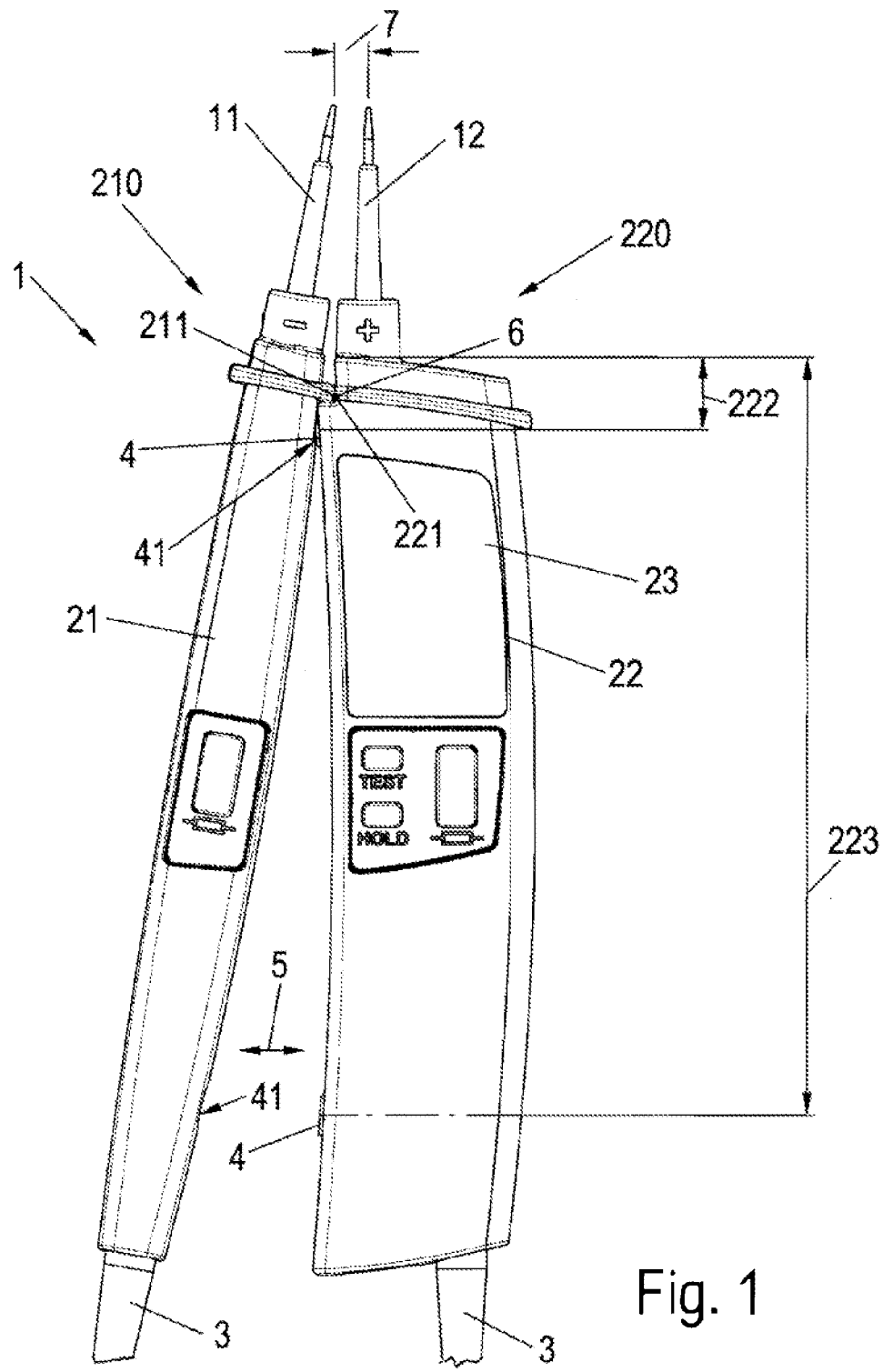
FIG. 1 is a side elevation view of a first embodiment of the measuring instrument when in a measuring first condition.

Referring first more particularly to FIG. 1, a measuring instrument 1, more particularly, a voltage tester, includes two probes 11, 12, which are each arranged in a housing 21, 22, respectively. In addition, measurement electronics 23 for processing a measurement, which are connected in an electrically conductive manner to the respective probe of the housing, are arranged in the housings 21, 22. The housings 21, 22 are connected to one another by a cable 3, wherein the electrical conductors (not shown) arranged in the cable 3 connect the measurement electronics in the housings 21, 22 to one another in an electrically conductive manner.

The housings 21, 22 are preferably at least partially produced from an electrically insulating material. Electrically conductive housing parts are preferably sheathed with a housing sheath made of an electrically insulating material. They each have a probe end 210, 220, at which the probes 11, 12 are accessible.

Pivot ribs 211, 221 are provided at the probe ends 210, 220 of the two housings 21, 22. The pivot ribs 211, 221 of the housings 21, 22 are implemented as corresponding to one another, so that the housings 21, 22 can be pivoted in relation to one another at the pivot ribs 211, 221 around a pivot axis 6. For this purpose, one of the two housings 22 has a rounded inner edge as the pivot edge 221, and the other of the two housings 21 has a rounded outer edge, corresponding to the rounded inner edge, as the pivot edge 211, which pivot edges can be pivoted away from one another around the pivot axis 6. The rounded inner edge 221 is formed by a grooved recess provided on the housing 22, and the rounded outer edge 211 is formed by a web-shaped formation on the other housing 21. As shown by a comparison of FIGS. 1 and 2, the distance 7 between the probes or tips 11, 12 can thus be changed in a simple manner, wherein an arrangement which can be handled well, and produce stable results, which allows the probes 11, 12 to be applied precisely to terminals or to be inserted into bushes of sockets, for example.

Figure 2:
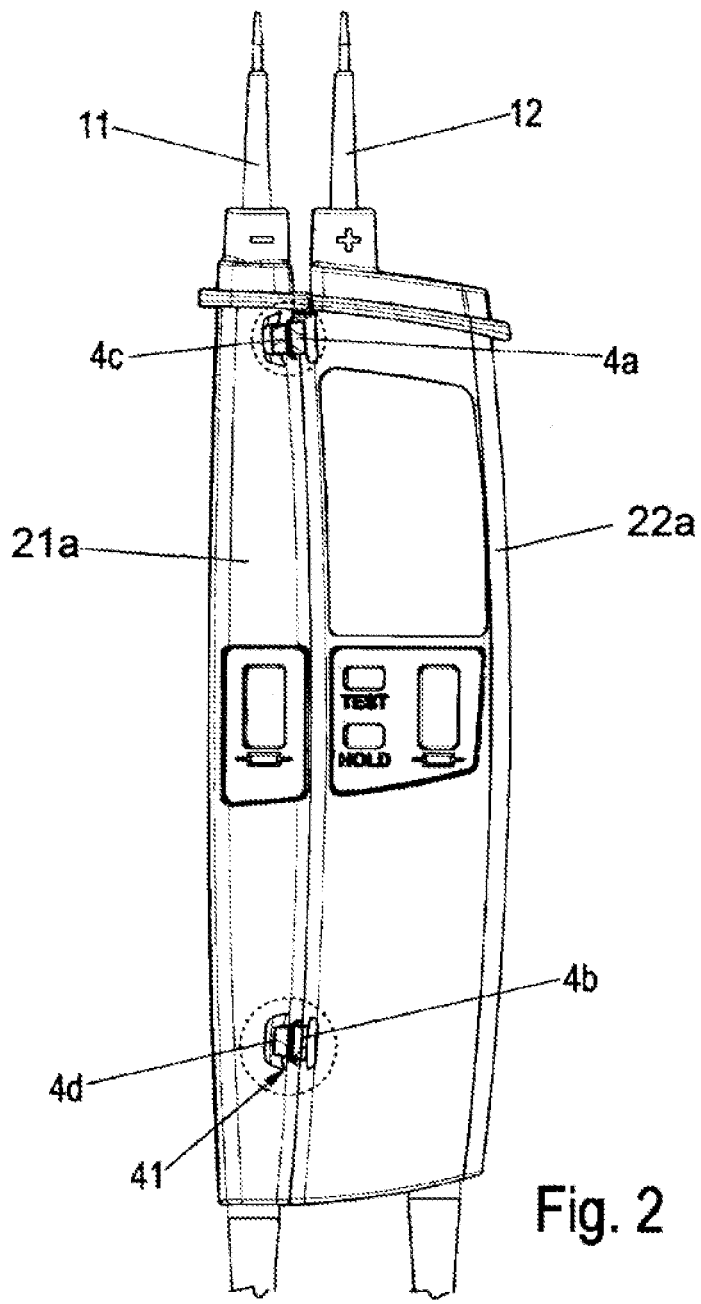
FIG. 2 is a side elevation view of a second embodiment of the measuring instrument when in a transporting second condition.

In the embodiment of FIG. 1, the measuring instrument 1 has two magnets 4 spaced apart from one another on one housing 22. In FIG. 1, the housing 22 is therefore formed from a magnetically attractive material. FIG. 2 shows the measuring instrument respectively having two magnets 4a-4d spaced apart from one another on each of the two housings 21, 22.

Corresponding to the arrangement of the magnets 4, 4a, 4b, recesses 41 are provided in the housing sheath on the other housing 21, through which an electrically conductive part of the housing 21 is accessible, or other magnets 4c, 4d, which have opposite polarization, on the other housing 21, in particular in the recess 41. The recesses 41 therefore each have the same distance 222, 223 from the probe end 210, 220, as the magnet 4, 4a, 4b corresponding thereto.

The magnets 4a, 4b of one housing 22 therefore attract the other housing 21 with an attraction force, or attract the other magnets 4c, 4d, which have opposite polarization, on the other housing, in particular in the recess 41. The distance 7 of the probes 11, 12 from one another can therefore be set by pivoting the housings 21, 22 about the pivot ribs 211, 221 in one actuation direction 5 against the attraction force of the magnets 4, 4a-4d and against the actuation direction 5 with the attraction force of the magnets 4, 4a-4d.

It is preferable to adapt the attraction force of the two magnets to one another in such a way that pivoting of the housings at the probe end is thus made easier. For this purpose, the magnetic attraction force of the magnet or magnets spaced farther away from the probe end is preferably greater than the attraction force of the magnet or magnets arranged closer to the probe end. The measuring instrument 1 can therefore be handled very well.

While in accordance with the provisions of the Patent Statutes the preferred forms and embodiments of the invention have been illustrated and described, it will be apparent to those skilled in the art that changes may be made without deviating from the invention described above.

What is claimed is:

1. A measuring instrument for testing voltages, comprising:
   (a) a pair of hollow probe housings (21; 22) each having first and second ends;
   (b) a pair of probes (11; 12) mounted in corresponding first ends of said housings, respectively;
   (c) a pair of cables (3) extending from corresponding second ends of said housings, respectively, said cables extending internally of said housings and being connected with said probes, respectively;
   (d) magnetic means (4) normally biasing said housings together toward a parallel transport condition relative to each other: and
   (e) pivot rib means (211:. 221) warmed in corresponding relation on said probe housings adjacent said first housing ends, thereby to afford pivotal relative movement of said housings to vary the spacing distance (7) between said probes.

2. A measuring instrument as defined in claim 1, wherein each of said pivot rib means extends circumferentially around the associated housing.

3. A measuring instrument as defined in claim 1, wherein said magnetic means comprises:
   (1) at least one magnet (4) arranged on a first one of said housings (22) adjacent the second one of said housings (21);
   (2) said second housing being formed of a magnetic material.

4. A measuring instrument as defined in claim 1, wherein said magnetic means comprises;
   (1) at least one first magnet (4a, 4b) arranged on a first one of said housings (22a) adjacent the second one of said housings (21a); and
   (2) at least one second magnet (4c, 4d) arranged on the second one of said housings opposite said first magnet, said magnets being arranged with opposite polarities, thereby to attract said housings together.

5. A measuring instrument as defined in claim 4, wherein at least two first magnets (4a, 41)1 are arranged in longitudinally spaced relation on said first housing adjacent the ends thereof, respectively, and at least two second magnets (4c, 4d) are arranged on said second housing opposite said first magnets, respectively.

6. A measuring instrument as defined in claim 5, wherein the first and second magnets arranged at the housing ends remote from said probes (4b, 4d) have a greater magnetic attractive force than the first and second magnets (4a, 4c) at the probe ends of said housings.

7. A measuring instrument for testing voltages, comprising:
   (a) a pair of hollow probe housings (21; 22) each having first and second ends;
   (b) a pair of probes (11; 12) mounted in corresponding first ends of said housings, respectively;
   (c) a pair of cables (3) extending from corresponding second ends of said housings, respectively, said cables extending internally of said housings and being connected with said probes, respectively;
   (d) magnetic means normally biasing said housings together toward a parallel transport condition relative to each other, said magnetic means including a first magnet (4, 4a) arranged on a first one of said housings (22, 22a) adjacent and spaced from the associated probe; and
(e) pivot rib means (211; 221) arranged in corresponding relation on said probe housings adjacent said first housing ends, thereby to afford precise pivotal relative movement of said housings to vary the spacing distance (7) between said probes, said pivot rib means including:
  (1) a first pivot rib (221) arranged on said first housing in the space between said first magnet and the associated probe;
  (2) said second pivot rib (211) being arranged on said second housing opposite said first pivot rib;
  (3) each of said pivot ribs extending circumferentially around the associate housing body.

8. A measuring instrument as defined in claim 7, wherein said magnetic means comprises:
  (1) a pair of said first magnets (4) arranged adjacent opposite ends of said first probe housing, respectively;
  (2) said second probe housing (21) being formed of a magnetic material.

9. A measuring instrument as defined in claim 7, wherein said magnetic means comprises:
  (1) a pair of said first magnets (4a, 4b) arranged in longitudinally spaced relation on said first housing adjacent the ends thereof, respectively, and
  (2) a pair of second magnets (4c, 4d) arranged in recesses (41) contained in said second housing opposite said first magnets, respectively.

10. A measuring instrument as defined in claim 9, wherein those first and second magnets (4b, 4d) arranged at the housing ends remote from said probes have a greater magnetic attractive force than the first and second magnets (4a, 4c) arranged at the probe ends of said housings.

* * * * *